(12) United States Patent  (10) Patent No.: US 6,364,712 B2
Dürr et al.  (45) Date of Patent: Apr. 2, 2002

(54) FILTER DEVICE FOR AT LEAST ONE ELECTRICAL LINE CONNECTABLE EXTERNALLY TO A HOUSING

(75) Inventors: Wolfgang Dürr, Meckesheim; Johann Schunn, Leimen; Manfred Streit, Heidelberg, all of (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 09/767,382

(22) Filed: Jan. 22, 2001

(30) Foreign Application Priority Data

Jan. 20, 2000 (DE) .......................................... 100 02 123

(51) Int. Cl.$^7$ ............................................. H01R 13/66
(52) U.S. Cl. ...................................... 439/620; 439/941
(58) Field of Search ................................. 439/620, 941

(56) References Cited

U.S. PATENT DOCUMENTS

| | | | | |
|---|---|---|---|---|
| 4,791,391 A | * | 12/1988 | Linnell et al. | ............... 333/184 |
| 5,280,257 A | * | 1/1994 | Cravens et al. | ............. 333/182 |
| 5,554,050 A | * | 9/1996 | Marpoe, Jr. | .................. 439/620 |
| 5,580,280 A | * | 12/1996 | Minich et al. | ............... 439/620 |
| 5,599,208 A | * | 2/1997 | Ward | ........................... 439/620 |
| 5,605,477 A | * | 2/1997 | Wu et al. | ..................... 439/620 |
| 5,639,264 A | * | 6/1997 | Belopolsky et al. | ......... 439/620 |
| 5,830,016 A | * | 11/1998 | Chuang | ........................ 439/620 |
| 5,873,751 A | * | 2/1999 | Daly et al. | .................. 439/620 |

FOREIGN PATENT DOCUMENTS

| DE | 131 516 | 5/1977 |
|---|---|---|
| DE | 77 39 031 | 4/1978 |
| DE | 29 43 861 C2 | 5/1980 |
| DE | 42 02 524 A1 | 8/1993 |
| DE | 42 36 593 A1 | 5/1994 |
| DE | 43 96 569 C2 | 6/1994 |
| DE | 197 41 746 C1 | 2/1999 |
| DE | 198 20 686 A1 | 11/1999 |
| EP | 0 869 585 A2 | 10/1998 |

* cited by examiner

*Primary Examiner*—Tulsidas Patel
(74) *Attorney, Agent, or Firm*—Herbert L. Lerner; Laurence A. Greenberg; Werner H. Stemer

(57) ABSTRACT

A filter device for at least one electrical line connectable externally to a housing includes at least one contact pin for connecting the externally connectable electrical line to a multilayer printed circuit board having at least one support layer and at least one conductor layer, the contact pin having a part thereof located at a side of the filter device and being affixed to the printed circuit board, at least one outer layer of the printed circuit board being formed as either a holohedral or a grid-shaped shielding layer, respectively, the shielding layer being in an electrically conductive contact-connection with the housing. A contact pin of a conductor path of the conductor layer conductable to the outside is connected to the printed circuit board, the contact pin being arranged without electrical connection to the shielding layer. An electrical filter element is connected to the contact pin, the filter element having an electrical property corresponding to a selected value of the corresponding filtering, the filter element being electrically conductively connected to the shielding layer.

11 Claims, 3 Drawing Sheets

FILTER DEVICE FOR AT LEAST ONE ELECTRICAL LINE CONNECTABLE EXTERNALLY TO A HOUSING

BACKGROUND OF THE INVENTION

Field of the Invention

The invention relates to a filter device for at least one electrical line that is connectable externally to a housing, for suppressing electromagnetic interference. In order to comply with electromagnetic compatibility in a device or installation with active electronics, the connecting lines generally have to be shielded from the outside or filtered. This also applies to signal lines in the low-voltage range.

For filtering connecting lines, it has become known heretofore to use filter plugs which are connectable to a printed circuit board or other components within a device.

At the present time, such filter plugs are available in a limited choice and are expensive. Furthermore, freedom in the design of the lines and the connection techniques and also the permissible current and voltage loads is greatly restricted.

SUMMARY OF THE INVENTION

It is accordingly an object of the invention to provide cost-effective filtering of the connecting lines which eliminates the disadvantages referred to hereinabove.

With the foregoing and other objects in view, there is provided, in accordance with the invention, a filter device for at least one electrical line connectable externally to a housing, comprising at least one contact pin for connecting the externally connectable electrical line to a multilayer printed circuit board having at least one support layer and at least one conductor layer, the at least one contact pin having a part thereof located at a side of the filter device and being affixed to the printed circuit board, at least one outer layer of the printed circuit board being formed as one of a holohedral and a grid-shaped shielding layer, respectively, the shielding layer being in an electrically conductive contact-connection with the housing, at least one contact pin of a conductor path of the conductor layer conductable to the outside being connected to the printed circuit board, the at least one contact pin being arranged without electrical connection to the shielding layer, an electrical filter element connected to the at least one contact pin, the filter element having an electrical property corresponding to a selected value of the corresponding filtering, the filter element being electrically conductively connected to the shielding layer.

In accordance with another feature of the invention, the electrical filter element is a capacitor having a suitable capacitance.

In accordance with a further feature of the invention, the capacitor is connected to the shielding layer via a very low-inductive link.

In accordance with an added feature of the invention, the capacitor is connected directly to the at least one contact pin and the shielding layer.

In accordance with an additional feature of the invention, the direct connection is by Surface Mounting Device or SMD technology.

In accordance with yet another feature of the invention, the shielding layer is formed with a margin that is conductive all around to a suitable width.

In accordance with yet a further feature of the invention, the filter device includes connectors for effecting the connection between the printed circuit board and the housing, the spacing between the connecting points being selected in accordance with, respectively, electromagnetic compatability or EMC criteria and a low-impedance electromagnetic compatability or EMC seal arranged between the printed circuit board and the housing.

In accordance with yet an added feature of the invention, the filter device includes an inductor additionally connected in the conductor path upline of the capacitor.

In accordance with yet an additional feature of the invention, the connection of the inductor is effected by SMD technology.

In accordance with another feature of the invention, the filter device includes at least two different capacitor values used for a plurality of lines.

In accordance with a concomitant feature of the invention, different combinations of current and voltage lines are present.

Thus, the filter device for at least one electrical line that is to be connected externally to a housing comprises at least one contact for the connection of the line that is to be connected from outside the housing, and a multilayer printed circuit board having at least one support layer and at least one conductive layer. The filter-side part of the contact is affixed to the printed circuit board. In this regard, at least one outer layer of the printed circuit board is embodied as either a holohedral or grid-shaped shielding layer. Furthermore, the shielding layer is in electrically conductive contact-connection with the housing. At least one contact pin of a conductor track or path of the conductor layer that is to be routed to the outside is connected to the printed circuit board, the contact pin being arranged without electrical connection to the shielding layer. An electrical filter element is secured to the contact pin, the electrical properties of the filter element corresponding to the selected value of the corresponding filtering. In this regard, the filter element is electrically conductively connected to the shielding layer.

This type of embodiment has the advantage that, within a plug, individual filter values are possible for each individual line. Furthermore, for the filtering, there is no restriction to a standard plug type, so that it is possible to use not only plugs but also clamps. Moreover, a plurality of contact pins can be made accessible simultaneously on a board, only some of the pins, however, in any case being assigned to a plug, so that rearranging the plug results in different filtering.

A capacitor having a suitable capacitance is advantageously used as the electrical filter element.

The filter effect is further improved by connecting the capacitor to the shielding layer via a very low-inductive link, in which case the capacitor can be connected directly to the contact pin and the shielding layer, preferably using SMD technology. This direct connection, in particular, produces effective filtering of interfering influences.

The marginal edge of the shielding layer is preferably formed so that it is conductive all around to a suitable width, thereby ensuring an areal electrical connection between the printed circuit board and the housing.

This connection between the printed circuit board and the housing is produced by using a threaded or screw connection and/or a rivet connection. In this regard, the spacing between the connecting points is selected in accordance with EMC criteria and/or a low-impedance EMC seal is arranged between the printed circuit board and the housing.

In order to improve the filter effect further, an inductor may additionally be connected in the conductor track or path upline of the capacitor, preferably by the use of SMD technology.

If at least two different capacitor values are used in conjunction with a plurality of lines, then individual filtering of individual lines can be achieved within a plug.

In this regard, different combinations of current and voltage lines may be present in a plug or on a printed circuit board.

Other features which are considered as characteristic for the invention are set forth in the appended claims.

Although the invention is illustrated and described herein as embodied in a filter device for at least one electrical line connectable externally to a housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, wherein:

DESCRIPTION OF THE PREFERRED EMBODIMENTS

Figure 1:
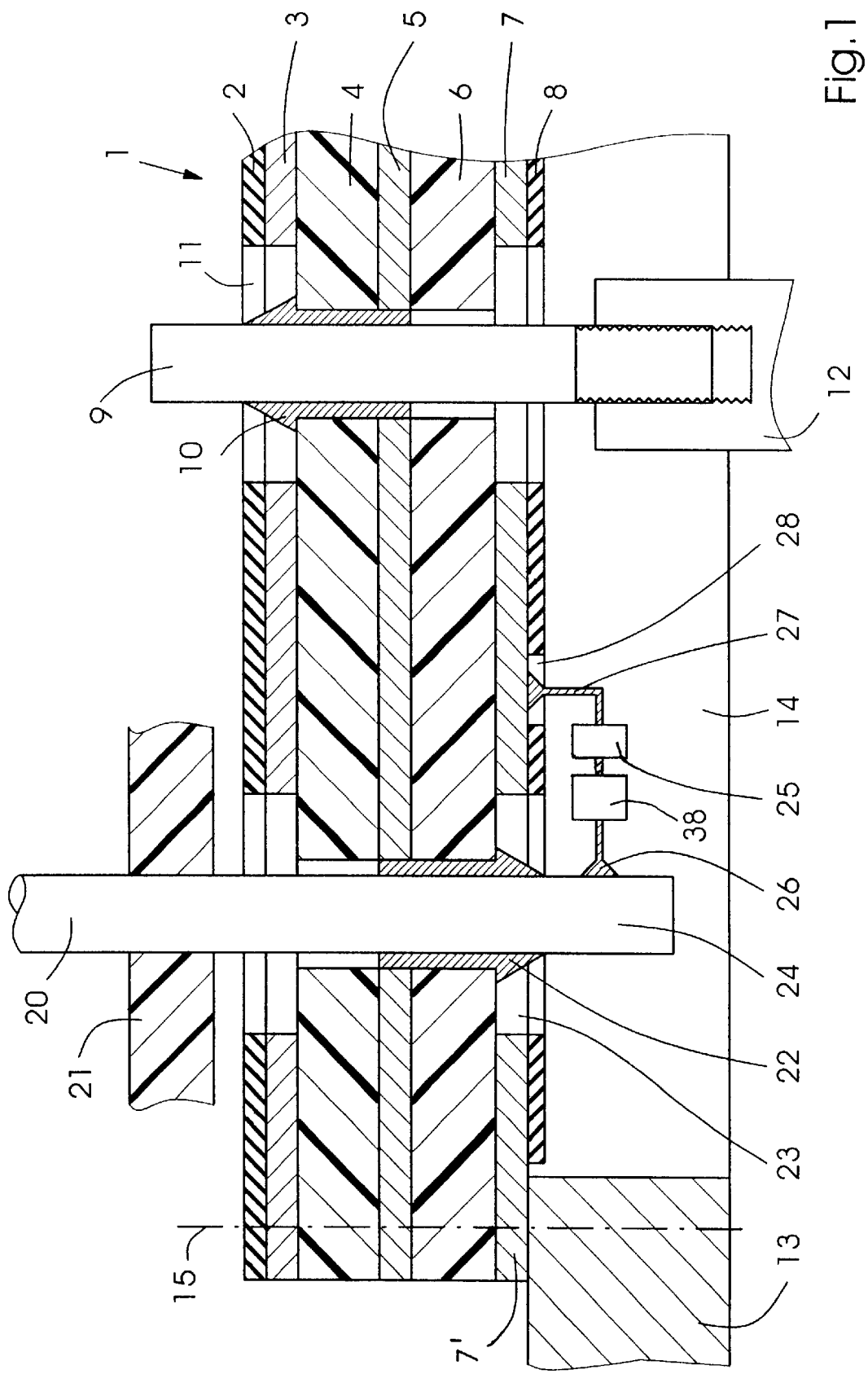
FIG. 1 is a diagrammatic cross-sectional view of a filter device in the vicinity of two contact pins.

Referring now to the drawings and, first, particularly to FIG. 1 thereof, there is shown therein a printed circuit board 1 constructed of a plurality of layers. At the outer side thereof, initially, a resist layer is applied as a protective layer 2 for protecting an underlying shielding layer 3 formed of electrically conductive material. The shielding layer 3 is arranged on an electrically insulating support layer 4. Disposed On the other side of the support layer 4 is a conductor layer 5, wherein electrical connections are produced via conductor paths or tracks between various locations of the printed circuit board 1.

The conductor layer 5 is, in turn, covered by a support layer 6, which is produced from an electrically insulating material having an inner shielding layer 7 applied thereon, the inner shielding layer 7 being, in turn, provided with a protective resist 8 as protective layer 2.

A first contact pin 9 is plugged into the printed circuit board 1, the pin 9 being electrically conductively connected to the conductor layer 5 by a soldered connection 10 secured on the support layer 4. In accordance with the prior art, it is also possible to select a pressure connection. In the vicinity of the contact pin 9, the protective layer 2 and the shielding layer 3 are formed with a cutout 11, so that electrical contact between the soldered connection 10 and the shielding layer 3 is reliably avoided.

A plug 12 surroundingly engages the contact pin 9 at the opposite end thereof, so as to produce an electrical connection. The plug 12 is disposed in the interior of a housing 13, of which just one wall is illustrated that is formed with a perforation 14 covered by the printed circuit board 1. Connectors 15, only one of which is illustrated diagrammatically in phantom, serve for connecting the printed circuit board 1 to the housing 13.

An output contact-connection to an electrical line that is to be connected externally to the housing 13 is effected via a contact pin 20, which is part of a plug housing 21. The contact pin 20 is likewise electrically connected to the conductor layer 5 by a soldered connection 22 or, alternatively, by a pressure connection, which is, in turn, disposed in a cutout 23 formed in the shielding layer 7 and in the protective resist 8.

The contact pin 20 has a contact pin foot or base 24 projecting beyond the shielding layer 7, an electrical filter element in the form of a capacitor 25 being electrically conductively secured to the contact pin foot 24 by a soldered connection 26. Furthermore, the capacitor 25 is electrically connected to the shielding layer 7 via a further connection 27, for which purpose a cutout 28 is formed in the protective layer 2 formed of photoresist 8.

The shielding layer 7, at the edge 7' thereof, is freed of the protective resist 8 to a suitable width, so that a peripheral ring is formed which is electrically conductively connected as a contact surface with the housing 13 as ground potential.

Figure 2:
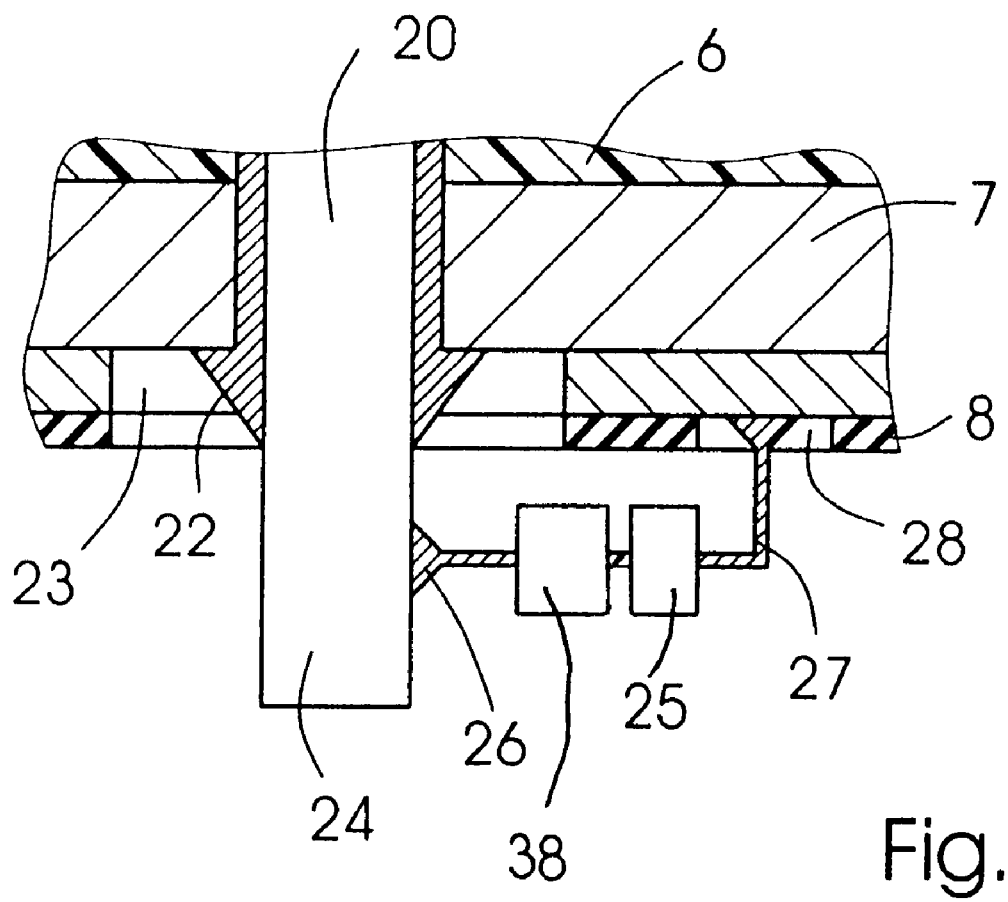
FIG. 2 is a fragmentary view of FIG. 1 showing, as a detail thereof, a connection of a filter element of the filter device to one of the contact pins, on the one hand, and to a shielding layer, on the other hand.

The connection of the filter element in the form of the capacitor 25 to the contact pin 20, on the one hand, and to the shielding layer 7, on the other hand, is again illustrated in a detail in FIG. 2. What is involved herein is a direct contact-connection which can be produced by Surface Mounting Device or SMD technology and which has a very low inductance. It is believed to be readily apparent that, besides the soldered connection 10, 22, 26 itself, no conductive paths or tracks have to be bridged between the contact pin 20 and the shielding layer 7.

The lowermost layer, as viewed in FIGS. 1 and 2, is formed entirely or at least partially as the shielding layer 7 to which the capacitor 25 is directly tied. A non-illustrated connection to the uppermost layer is effected via a multiplicity of plated-through holes and galvanized or electroplated pass-through connections. In principle, the filter capacitor can also be arranged on the shielding layer 3, depending upon the plug type respectively used.

A shielding effect is produced because parts of a plug connection which are connected via the inner conductor tracks or paths are arranged on both outer layers.

Figure 3:
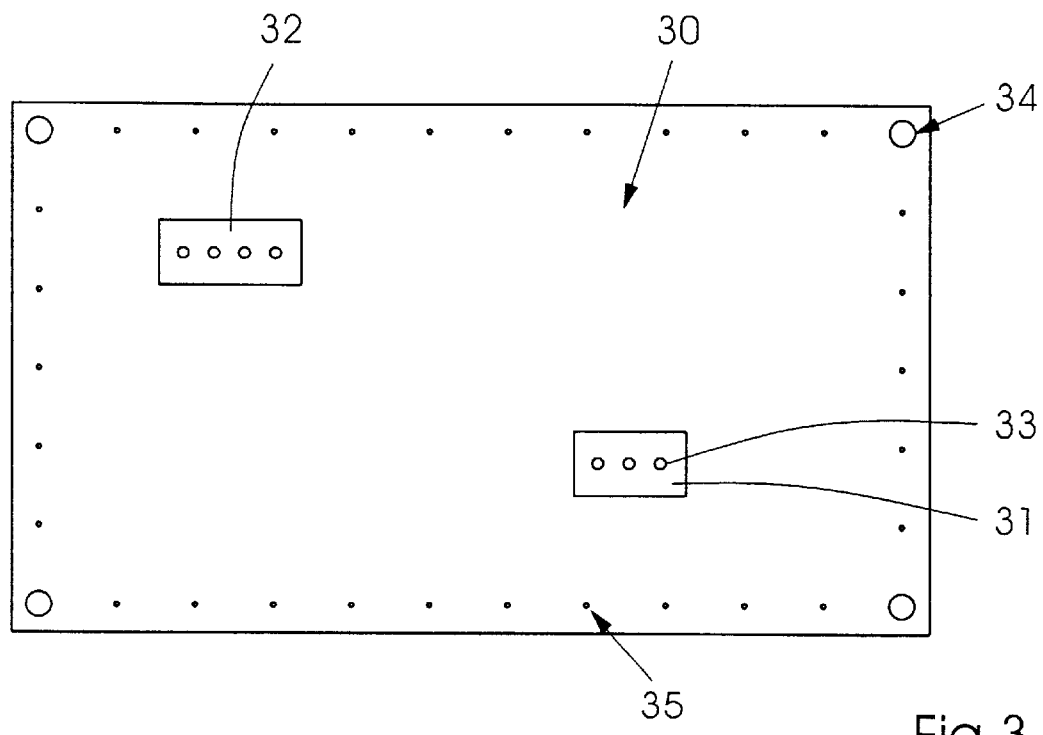
FIG. 3 is a top plan view of a filter printed circuit board.

FIG. 3 is a top plan view of a filter printed circuit board 30 with two plug connections 31 and 32, and contact pins 33 arranged within the plug connections 31 and 32. The side facing the viewer is formed as a shielding layer. The filter printed circuit board 30 is connected via fastening holes 34 to a non-illustrated housing by non-illustrated connectors and, via pass-through contacts 35, is in electrical contact with a shielding layer located on the side which is remote from the viewer.

Figure 4:
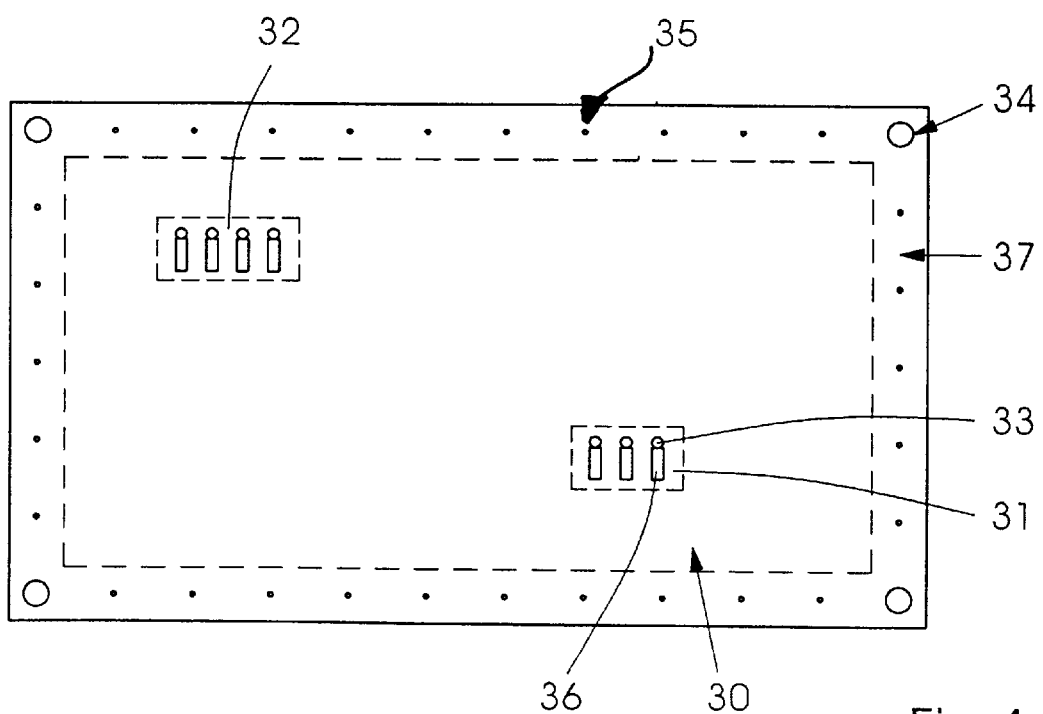
FIG. 4 is a bottom plan view of FIG. 3.

FIG. 4 shows the filter board 30 from underneath, i.e., in a bottom plan view, wherein the contact pins 33 of the plug connections 31 and 32, to which capacitors 36 are applied, are readily discernible. This bottom side faces a housing and covers an opening in the housing. For shielding purposes, the electrically conductive printed circuit board edge 37 is conductive, for example, by having the corresponding protective layer removed from the shielding layer.

In principle, it is conceivable to dispense with one of the two shielding layers as long as the desired filtering is achieved. If necessary or desirable, an electromagnetic compatability or EMC seal and additional mechanical sealing elements may also be employed. A crucial factor is that there be a sufficiently large bearing surface for electromechanically coupling the filter printed circuit board to the housing. The shielding layers themselves may be grid-shaped or holohedral and, if grid-shaped, the mesh width to be selected must be small enough.

With the shielding layers and plated-through holes, a type of housing is produced which acts as a Faraday cage and shields the conductor tracks or paths. Furthermore, an opening present in the switchgear cabinet is electromagnetically closed.

We claim:

1. A filter device for at least one electrical line connectable externally to a housing, comprising: at least one contact pin for connecting the externally connectable electrical line, an electrical filter element connected to said at least one contact pin, a multilayer printed circuit board having at least one support layer, at least one outer layer and at least one conductor layer, and connectors for effecting a connection between said printed circuit board and the housing,
said at least one contact pin having a part thereof located at a side of the filter device and being affixed to said printed circuit board, said at least one outer layer of said printed circuit board being formed as one of a holohedral and a grid-shaped shielding layer, respectively, said shielding layer being in an electrically conductive contact-connection with the housing, said at least one contact pin of a conductor path of said conductor layer conductable to the outside being connected to said printed circuit board, said at least one contact pin being arranged without electrical connection to said shielding layer, said filter element having an electrical property corresponding to a selected value of the corresponding filtering, said filter element being electrically conductively connected to said shielding layer.

2. The filter device according to claim 1, wherein said electrical filter element is a capacitor having a suitable capacitance.

3. The filter device according to claim 2, wherein said capacitor is connected to said shielding layer via a very low-inductive link.

4. The filter device according to claim 3, wherein said capacitor is connected directly to said at least one contact pin and said shielding layer.

5. The filter device according to claim 4, wherein the direct connection is by SMD technology.

6. The filter device according to claim 1, wherein said shielding layer is formed with a margin that is conductive all around to a suitable width.

7. The filter device according to claim 1, wherein the spacing between the connecting points of said connectors being selected in accordance with, respectively, EMC criteria and a low-impedance EMC seal arranged between said printed circuit board and the housing.

8. The filter device according to claim 2, including an inductor additionally connected in the conductor path upline of said capacitor.

9. The filter device according to claim 8, wherein the connection of the inductor is effected by SMD technology.

10. The filter device according to claim 2, wherein at least two different capacitor values are used for a plurality of lines.

11. The filter device according to claim 1, wherein different combinations of current and voltage lines are present.

* * * * *